United States Patent
Matsuda

(10) Patent No.: US 6,798,025 B2
(45) Date of Patent: Sep. 28, 2004

(54) INSULATED GATE BIPOLAR TRANSISTOR

(75) Inventor: Tadashi Matsuda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/376,326

(22) Filed: Mar. 3, 2003

(65) Prior Publication Data

US 2003/0183874 A1 Oct. 2, 2003

(30) Foreign Application Priority Data

Mar. 27, 2002 (JP) .......................................... 2002-089071
Nov. 11, 2002 (JP) .......................................... 2002-327165

(51) Int. Cl.[7] .............................................. H01L 29/94
(52) U.S. Cl. ...................................... 257/378; 257/341
(58) Field of Search .................................. 257/341, 378

(56) References Cited

U.S. PATENT DOCUMENTS

| | | | | |
|---|---|---|---|---|
| 5,084,401 A | * | 1/1992 | Hagino | 438/138 |
| 5,331,194 A | * | 7/1994 | Ueno | 257/498 |
| 6,147,381 A | | 11/2000 | Hirler et al. | 257/328 |

FOREIGN PATENT DOCUMENTS

| DE | 19945639 A1 | * 4/2001 | ......... H01L/29/739 |
|---|---|---|---|
| JP | 2000-509916 | 8/2000 | |

* cited by examiner

Primary Examiner—Allan R. Wilson
(74) Attorney, Agent, or Firm—Oblon, Spivak, McClelland, Maier & Neustadt, P.C.

(57) ABSTRACT

A semiconductor device in accordance with present invention includes a first conduction type first semiconductor layer; a second conduction type second semiconductor layer which is formed on the first semiconductor layer and has a substantially uniform impurity concentration; a plurality of first conduction type base layers formed in the surface of the second semiconductor layer; a plurality of second conduction type emitter layers formed in the surfaces of the respective base layers; channel regions formed in the surfaces of the respective base layers and between the emitter layers and the second semiconductor layer; a first conduction type auxiliary base layer formed in the surface of the second semiconductor layer between two base layers adjacent to each other; a gate electrode formed via a gate insulating film on the second semiconductor layer between the auxiliary base layer and the two base layers and on the channel regions; an emitter electrode connected to the base layers and the emitter layers; and a collector electrode connected to the first semiconductor layer.

18 Claims, 4 Drawing Sheets

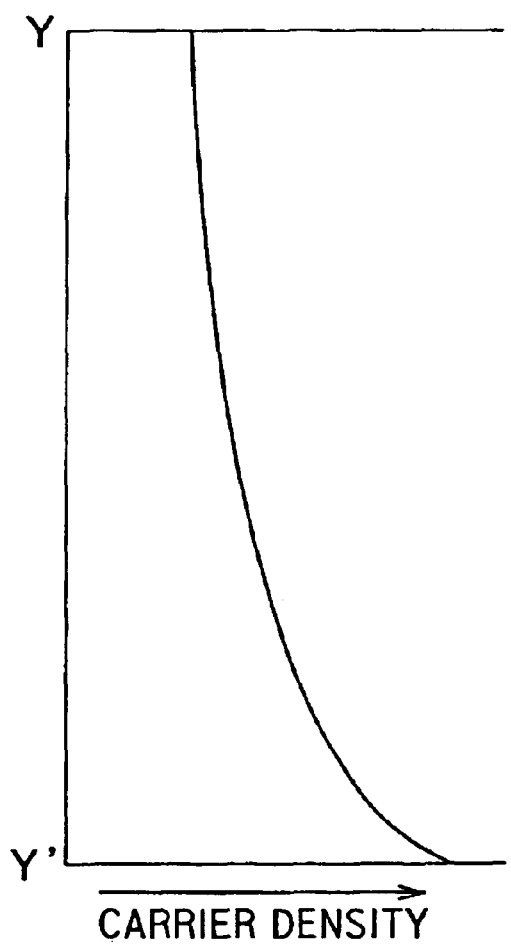 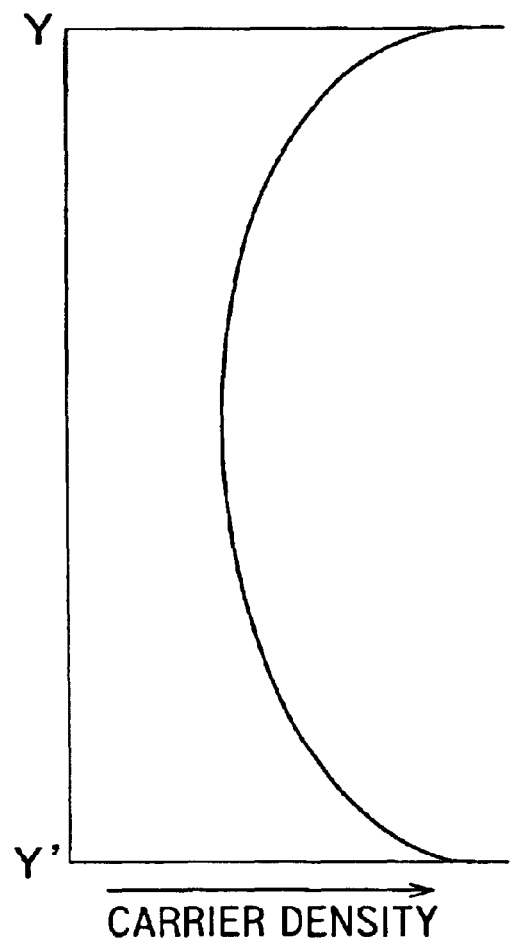
FIG. 3A
BACKGROUND ART
FIG. 3B
BACKGROUND ART

【図 2】

【図 3】

INSULATED GATE BIPOLAR TRANSISTOR

CROSS-REFFERENCE TO RELATED APPLICATION

This application is based upon and claims the benefit of priority from the prior Japanese Patent Application No. 2002-089071, filed on Mar. 27, 2002 and the prior Japanese Patent Application No. 2002-327165, filed on Nov. 11, 2002, the entire contents of which are incorporated herein by reference.

BACKGROUNG OF THE INVENTION

1. Field of the Invention

The present invention relates to a semiconductor device and in particular, to a planar gate type Insulated Gate Bipolar Transistor (hereinafter referred to as IGBT).

2. Related Background Art

A market requirement for reducing loss in a semiconductor element for electric power has been stronger and an IGBT capable of controlling large electric power by a voltage driving is required to be further reduced in ON voltage.

FIG. 1 is a cross-sectional structural view of a conventional typical planar gate type IGBT.

The conventional typical planar gate type IGBT has a $p^+$ type silicon substrate 11; a high-resistant $n^-$ type layer 12 which is formed on the $p^+$ type silicon substrate 11 and has a low impurity concentration; a plurality of p type base layers 13 which are formed at predetermined intervals in portions near the surface of the $n^-$ type layer 12; $n^+$ type emitter layers 14 each of which is formed in a portion near the surface in the vicinity of each of both ends of each p type base layer 13; channel regions 15 each of which is formed in each of both ends of each p type base layer 13; gate insulating films 16 each of which is formed on a region extending from one of the two channel regions 15 which are adjacent to each other via a portion near the surface of the $n^-$ type layer 12 to the other; gate electrodes 17 each of which is formed on each of the gate insulating films 16; insulating films 21 each of which is formed on a region over the gate insulating film 16 so as to cover each gate electrode 17; emitter electrodes 18 each of which is formed so as to be in ohmic contact with the surfaces of the p type base layer 13 and the $n^+$ type emitter layer 14 except for a portion covered with the gate insulating film 16; and a collector electrode 19 which is formed so as to be in ohmic contact with the reverse surface of the $p^+$ type silicon substrate 11.

A method of manufacturing the conventional typical planar gate type IGBT shown in FIG. 1 is as follows.

First, the high-resistant $n^-$ type layer 12 having a low impurity concentration is epitaxially grown on the $p^+$ type silicon substrate 11.

After the $n^-$ type layer 12 is formed, the plurality of base layers 13 are formed at predetermined intervals in portions near the surface of the $n^-$ type layer 12 by diffusing impurities by a Diffusion Self Align (DSA) method. Further, the $n^+$ type emitter layer 14 is formed in a portion near the surface in the vicinity of each of both ends of each p type base layer 13 by diffusing impurities by the same DSA method. That is, by using a diffusion opening used for forming the p type base layer 13 by diffusion, as it is, as a part of diffusion opening for forming the $n^+$ type emitter layer 14 by diffusion, a double diffusion is performed to form the $n^+$ type emitter layer 14 in a state where the channel regions 15 remain in a self-aligning manner in both end portions of each p type base layer 13.

After the p type base layers 13, the $n^+$ type emitter layers 14 and the channel regions 15 are formed, each of the gate insulating films 16 is formed on the two channel regions 15 adjacent to each other via a portion near the surface of the $n^-$ type layer 12, and the gate electrodes 17 are formed with polysilicon or aluminum on the gate insulating films 16. Further, the insulating films 21 for covering the respective gate electrodes 17 are formed on the regions over the gate insulating films 16.

After the gate insulating films 16, the gate electrodes 17 and the insulating films 21 are formed, the emitter electrodes 18 each of which is in ohmic contact with the surfaces of the p type base layer 13 and the $n^+$ type emitter layer 14 except for a portion covered with the gate insulating film 16 are formed by evaporating or sputtering metal such as aluminum.

Further, the collector electrode 19 which is in ohmic contact with the reverse surface of the $p^+$ type silicon substrate 11 is formed by evaporating or sputtering metal such as vanadium-nickel-gold (V—Ni—Au). In this manner, the conventional typical planar gate type IGBT shown in FIG. 1 is completed.

Various types of IGBTs have been developed and, for example, for the purpose of reducing a forward voltage, in order to increase a density of a small number of carriers on a negative electrode side, there is proposed an IGBT in which a shielding region is introduced around a base region (see, for example, Japanese Patent Publication No. 2000-509916).

The reducing ON voltage of the IGBT, as is the case with a MOSFET (Metal Oxide Semiconductor Field Effect Transistor), has been achieved mainly by reducing a channel resistance by reducing the size of a unit cell by a micro pattern lithographic technique.

In the IGBT of a device having a small number of carriers, however, it has been known that the enlarging of the width of the gate electrode 17 can further reduce an emitter contact area per unit area to prevent holes implanted from the $p^+$ type silicon substrate 11 to the $n^-$ type layer 12 from being discharged more than necessary and to increase the carrier density of holes so as to compensate an electron accumulating layer produced under the gate electrode 17 according to an electric charge neutralizing condition, whereby resistance in this region is reduced to reduce the ON voltage as a result.

FIG. 2 is a cross-sectional structural view of a planar gate type IGBT in which the width of a gate electrode is enlarged. The structure and the manufacturing method of this planar gate type IGBT are the completely same as those of the planar gate type IGBT shown in FIG. 1, except for enlarging the width of the gate.

FIGS. 3A and 3B are graphs showing a carrier distribution along a line Y–Y' in the cross-sectional structural view of the conventional planar gate type IGBT shown in FIG. 1 and FIG. 2.

As described above, by enlarging the width of the gate electrode 17 of the planar gate type IGBT, it is possible to reduce the ON voltage.

However, if the width of the gate electrode 17 is too much enlarged, a depletion layer produced in a blocking state at a pn junction of the p type base layer 13 and the $n^-$ type layer 12 can not be pinched off between the p type base layer 13 and the p type base layer 13 which are adjacent to each other via the n⁻ type layer 12 to increase an electric field intensity. This phenomenon appears at a point in the graph shown in FIG. 3B where the carrier density on Y side is higher as compared with the graph in FIG. 3A. As a result, this reduces a withstand voltage, so it is impossible to make the width of the gate electrode 17 extremely wide. The enlarged width of the gate electrode 17 is limited to about 36 μm for producing a withstand voltage of 600 V and 56 μm for producing a withstand voltage of 1200 V.

Moreover, if the width of the gate electrode 17 is enlarged, an input capacity Cies and a feedback capacity Cres are increased. This might present also problems that a switching time is increased, or a collector current, a collector voltage and a gate voltage easily oscillate when a load is short-circuited and, in some case, leads to causing an oscillation breakdown.

SUMMARY OF THE INVENTION

A semiconductor device according to the first aspect of the present invention comprises:
- a first conduction type first semiconductor layer;
- a second conduction type second semiconductor layer which is formed on the first semiconductor layer and has a substantially uniform impurity concentration;
- a plurality of first conduction type base layers formed in the surface of the second semiconductor layer;
- a plurality of second conduction type emitter layers formed in the surface of the respective base layers;
- channel regions formed in the surfaces of the respective base layers and between the emitter layers and the second semiconductor layer;
- a first conduction type auxiliary base layer formed in the surface of the second semiconductor layer between the two base layers adjacent to each other;
- a gate electrode formed via a gate insulating film on the second semiconductor layer between the auxiliary base layer and the two base layers and on the channel regions;
- an emitter electrode connected to the base layers and the emitter layers; and
- a collector electrode connected to the first semiconductor layer.

A semiconductor device according to the second aspect of the present invention comprises:
- a first conduction type first semiconductor layer;
- a second conduction type second semiconductor layer formed on the first semiconductor layer;
- a plurality of first conduction type base layers formed in the surface of the second semiconductor layer;
- a plurality of second conduction type emitter layers formed in the surface of the respective base layers;
- channel regions formed in the surfaces of the respective base layers and between the emitter layers and the second semiconductor layer;
- a first conduction type auxiliary base layer which is formed in the surface of the second semiconductor layer between the two base layers adjacent to each other and whose depth from the surface of the second semiconductor layer is nearly equal to a depth of the base layer;
- a gate electrode formed via a gate insulating film on the second semiconductor layer between the auxiliary base layer and the two base layers and on the channel regions;
- an emitter electrode connected to the base layers and the emitter layers; and
- a collector electrode connected to the first semiconductor layer.

A semiconductor device according to the third aspect of the present invention comprises:
- a first conduction type first semiconductor layer;
- a second conduction type second semiconductor layer formed on the first semiconductor layer;
- a plurality of first conduction type base layers formed in the surface of the second semiconductor layer;
- a plurality of second conduction type emitter layers formed in the surface of the respective base layers;
- channel regions formed in the surfaces of the respective base layers and between the emitter layers and the second semiconductor layer;
- a plurality of first conduction type auxiliary base layers formed in the surface of the second semiconductor layer between the two base layers adjacent to each other;
- a gate electrodes formed via a gate insulating film on the second semiconductor layer between the auxiliary base layers and the two base layers and on the channel regions;
- an emitter electrode connected to the base layers and the emitter layers; and
- a collector electrode connected to the first semiconductor layer.

A semiconductor device according to the fourth aspect of the present invention comprises:
- a first conduction type first semiconductor layer;
- a second conduction type second semiconductor layer formed on the first semiconductor layer;
- a plurality of first conduction type base layers formed in the surface of the second semiconductor layer;
- a plurality of second conduction type emitter layers formed in the surface of the respective base layers;
- channel regions formed in the surfaces of the respective base layers and between the emitter layers and the second semiconductor layer;
- a first conduction type auxiliary base layer formed in the surface of the second semiconductor layer between the two base layers adjacent to each other;
- a gate electrode formed on a region extending from one of the two channel regions between the auxiliary base layer and the two base layers to the other;
- an emitter electrode connected to the base layers and the emitter layers; and
- a collector electrode connected to the first semiconductor layer.

BRIEF DESCRIPTION OF THE DRAWINGS

FIG. 3A and FIG. 3B are graphs each showing a carrier distribution along a line Y–Y' in the cross-sectional structural view of the conventional planar gate type IGBT shown in FIG. 1 and FIG. 2;

DETAILED DESCRIPTION OF THE EMBODIMENTS

Embodiments of a semiconductor device in accordance with the present invention will be described below with reference to the drawings.

Figure 1:
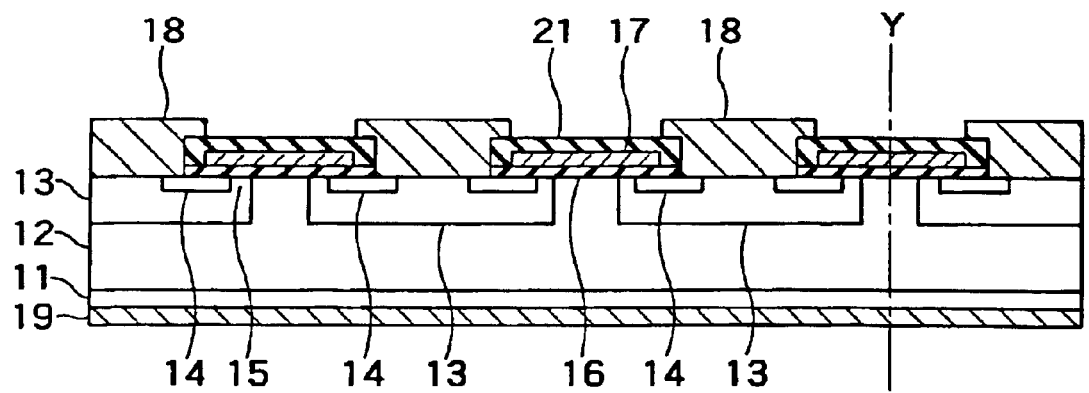
FIG. 1 is a cross-sectional structural view of a conventional typical planar gate type IGBT.
Figure 2:
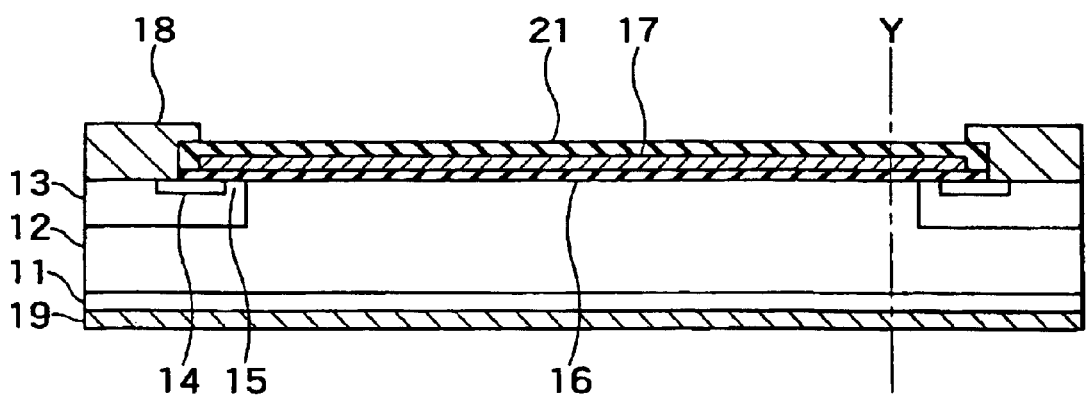
FIG. 2 is a cross-sectional structural view of a planar gate type IGBT in which the width of a gate electrode is enlarged.
Figure 4:
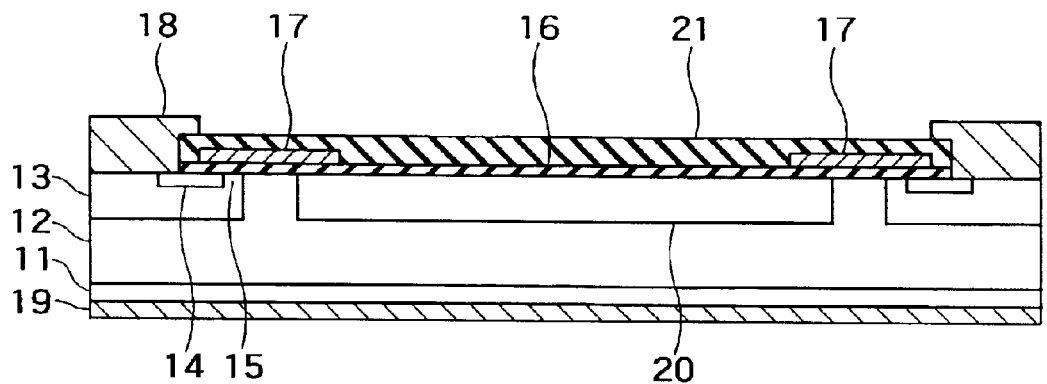
FIG. 4 is a cross-sectional structural view of a semiconductor device in accordance with a first embodiment of the present invention.

FIG. 4 is a cross-sectional structural view of a semiconductor device in accordance with a first embodiment of the present invention.

The semiconductor device in accordance with the first embodiment of the present invention has a p$^+$ type silicon substrate 11; a high-resistant n$^-$ type layer 12 which is formed on the p$^+$ type silicon substrate 11 and has a low impurity concentration; a plurality of p type base layers 13 which are formed at predetermined intervals in portions near the surface of the n$^-$ type layer 12; n$^+$ type emitter layers 14 each of which is formed in a portion near the surface in the vicinity of each of both ends of each p type base layer 13; channel regions 15 each of which is formed in each of both ends of each p type base layer 13; p type auxiliary base layers 20 each of which is formed in a portion near the surface of the n$^-$ type layer 12 between the two channel regions 15 which are adjacent to each other via a portion near the surface of n$^-$ type layer 12 in a state where it is separated from the two channel regions 15; gate insulating films 16 each of which is formed on a region extending from one of the two channel regions 15 to the other; gate electrodes 17 which are formed on the gate insulating film 16 in a region extending from one of the two channel regions 15 to one end of the p type auxiliary base layer 20 and on the gate insulating film 16 in a region extending from the other end of the p type auxiliary base layer 20 to the other of the two channel regions 15, respectively; insulating films 21 each of which is formed on a region over the gate insulating film 16 so as to cover each gate electrode 17; emitter electrodes 18 each of which is formed so as to be in ohmic contact with the surfaces of the p type base layer 13 and the n$^+$ type emitter layer 14 except for a portion covered with the gate insulating film 16; and a collector electrode 19 which is formed so as to be in ohmic contact with the reverse surface of the p$^+$ type silicon substrate 11.

The semiconductor device in accordance with the first embodiment of the present invention is characterized in that the p type auxiliary base layer 20 is formed on a portion near the surface of the n$^-$ type layer 12 between the two channel regions 15 which are adjacent to each other via a portion near the surface of the n$^-$ type layer 12 in a state where it is separated from the two channel regions 15 and that the gate electrodes 17 are formed on the gate insulating film 16 in a region extending from one of the two channel regions 15 to one end of the p type auxiliary base layer 20 and on the gate insulating film 16 in a region extending from the other end of the p type auxiliary base layer 20 to the other of the two channel regions 15, respectively.

The p type auxiliary base layer 20 is formed in such a way that its depth from the surface of the n$^-$ type layer 12 is substantially equal to the depth of the p type base layer 13. Moreover, the p type auxiliary base layer 20 is formed so as to be at a floating potential or to have a large diffusion resistance. That is, any electrode is prevented from being in contact with the p type auxiliary base layer 20 or the p type auxiliary base layer 20 is partially connected to the p type base layer 13 by a diffusion layer. Here, the n$^-$ type layer 12 has a substantially uniform impurity concentration.

In the semiconductor device in accordance with the first embodiment of the present invention, by forming the p type auxiliary base layer 20 described above, an emitter contact area per unit area can be reduced without enlarging the width of the gate electrode 17 to prevent holes implanted from the p$^+$ type silicon substrate 11 to the n$^-$ type layer 12 from being discharged more than necessary, thereby increasing the carrier density of holes right below the p type auxiliary base layer 20. As a result, in a planar gate type IGBT, it is possible to easily and effectively realize a low ON voltage and a high-speed switching characteristic while avoiding a decrease in a withstand voltage, an increase in an input capacity Cies and a feedback capacity Cres, and an occurrence of oscillation when a load is short-circuited.

A method of manufacturing the above-mentioned semiconductor device in accordance with the first embodiment of the present invention will be described, taking a case of an element of a 1200 V family as an example.

First, the high-resistant n$^-$ type layer 12 having a low impurity concentration is epitaxially grown to a thickness of about 200 μm on the p$^+$ type silicon substrate 11. In this respect, as described above, the impurity concentration of the n$^-$ type layer 12 is made substantially uniform.

After the n$^-$ type layer 12 is formed, the gate insulating film 16 is formed to a thickness of about 0.1 μm on the surface of the n$^-$ type layer 12 and then the polysilicon gate electrode 17 is deposited to a thickness of about 0.5 μm on the gate insulating film 16.

After the polysilicon gate electrode 17 is deposited, the polysilicon gate electrode 17 is partially removed or opened and boron (B) ions are implanted by using the opened polysilicon gate electrode 17 as a mask and then the p type base layer 13 and the p type auxiliary base layer 20 are formed to a thickness of about 4 μm by thermal diffusion. Any electrode is prevented from being in contact with the p type auxiliary base layer 20 or the p type auxiliary base layer 20 is partially connected to the p type base layer 13 by the diffusion layer. In this manner, the p type auxiliary base layer 20 becomes at a floating potential or has a large diffusion resistance. The p type base layer 13 and the p type auxiliary base layer 20 are formed at the same time by the same process, so their depths from the surface of the n$^-$ type layer 12 become substantially equal to each other.

After the p type base layer 20 and the p type auxiliary base layer 20 are formed, only portions near both ends of the p type base layer 13 are coated with a resist and the resist is patterned to form the n$^+$ type emitter layer 14 and then arsenic (As) ions are implanted thereinto and then the n$^+$ type emitter layer 14 is formed to a thickness of about 0.3 μm by the thermal diffusion. That is, the n$^+$ type emitter layer 14 is formed in a state where the channel region 15 remains in a manner of self-alignment only on the end portions of the p type base layer 13.

After the n⁺ type emitter layer 14 and the channel region 15 are formed, gate electrodes 17 are formed, by polysilicon or aluminum, on the gate insulating film 16 in a region extending from the channel region 15 adjacent to one end of the p type auxiliary base layer 20 via a portion near the surface of the n⁻ type layer 12 to the one end of the p type auxiliary base layer 20 and on the gate insulating film 16 in a region extending from channel region 15 adjacent to the other end of the p type auxiliary base layer 20 via a portion near the surface of the n⁻ type layer 12 to the other end portion of the p type auxiliary base layer 20, respectively.

Here, in the case of the element of the 1200 V family, examples of widths of the gate electrode 17, the p type base layer 13 and the p type auxiliary base layer 20 are about 6 μm, 6 μm, and 70 μm, respectively.

After the gate electrode 17 is formed, the insulating film 21 covering each gate electrode 17 is formed on a region over the gate insulating film 16.

After the insulating film 21 is formed, the emitter electrode 18 which is in ohmic contact with the surfaces of the p type base layer 13 and the n⁺ type emitter layer 14 except for the portion covered with the gate insulating film 16 is formed by evaporating or sputtering metal such as aluminum.

Further, the collector electrode 19 which is in ohmic contact with the reverse surface of the p⁺ type silicon substrate 11 is formed by evaporating or sputtering metal such as vanadium-nickel-gold (V—Ni—Au) to complete the semiconductor device in accordance with the first embodiment of the present invention, shown in FIG. 4, that is, a planar gate type IGBT.

As described above, the semiconductor device in accordance with the first embodiment of the present invention can easily and effectively realize the low ON voltage and the high-speed switching characteristic while avoiding a decrease in the withstand voltage, an increase in the input capacity Cies and the feedback capacity Cres, and the occurrence of oscillation when a load is short-circuited in the planar gate type IGBT.

Figure 5:
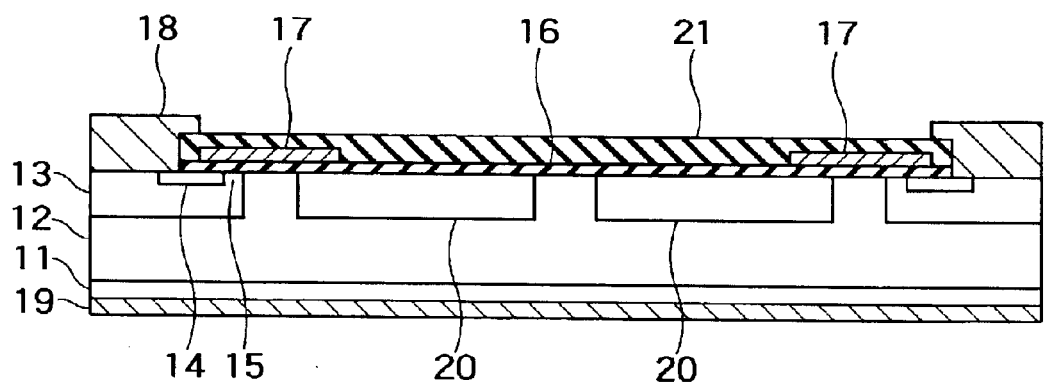
FIG. 5 is a cross-sectional structural view of a semiconductor device in accordance with a second embodiment of the present invention.

FIG. 5 is a cross-sectional structural view of a semiconductor device in accordance with a second embodiment of the present invention.

The semiconductor device in accordance with the second embodiment of the present invention has the p⁺ type silicon substrate 11; the high-resistant n⁻ type layer 12 which is formed on the p⁺ type silicon substrate 11 and has a low impurity concentration; the plurality of p type base layers 13 which are formed at predetermined intervals in portions near the surface of the n⁻ type layer 12; the n⁺ type emitter layers 14 each of which is formed on a portion near the surface in the vicinity of each of both end portions of each p type base layer 13; the channel regions 15 each of which is formed in each of both end portions of each p type base layer 13; the p type auxiliary base layer 20 which is formed in a portion near the surface of the n⁻ type layer 12 between the two channel regions 15 which are adjacent to each other via a portion near the surface of n⁻ type layer 12 in a state where it is separated from the above-mentioned two channel regions 15 and is divided into a plurality of portions; the gate insulating films 16 each of which is formed on a region extending from one of the above-mentioned two channel regions 15 to the other; the gate electrodes 17 which are formed on the gate insulating film 16 in a region extending from the channel region 15, which is adjacent to one end of one of the p type auxiliary base layer 20 on both ends of the plurality of p type auxiliary base layers 20 via a portion near the surface of the n⁻ type layer 12, to the above-mentioned one end of the above-mentioned one of the p type auxiliary base layer 20 and on the gate insulating film 16 in a region extending from the channel region 15, which is adjacent to one end of the other of the p type auxiliary base layer 20 on both ends of the plurality of p type auxiliary base layers 20 via a portion near the surface of the n⁻ type layer 12, to the above-mentioned one end of the above-mentioned other of the p type auxiliary base layer 20, respectively; the insulating films 21 each of which is formed on a region over the gate insulating film 16 so as to cover each gate electrode 17; the emitter electrodes 18 each of which is formed so as to be in ohmic contact with the surfaces of the p type base layer 13 and the n⁺ type emitter layer 14 except for a portion covered with the gate insulating film 16; and the collector electrode 19 which is formed so as to be in ohmic contact with the reverse surface of the p⁺ type silicon substrate 11.

The semiconductor device in accordance with the second embodiment of the present invention is different from the semiconductor device in accordance with the first embodiment of the present invention only in that the p type auxiliary base layer 20 is divided into a plurality of parts. However, all the other constitutions thereof are the same as those of the first embodiment of the present invention.

The semiconductor device in accordance with the second embodiment of the present invention can also produce the same effect as the semiconductor device in accordance with the first embodiment of the present invention.

Figure 6:
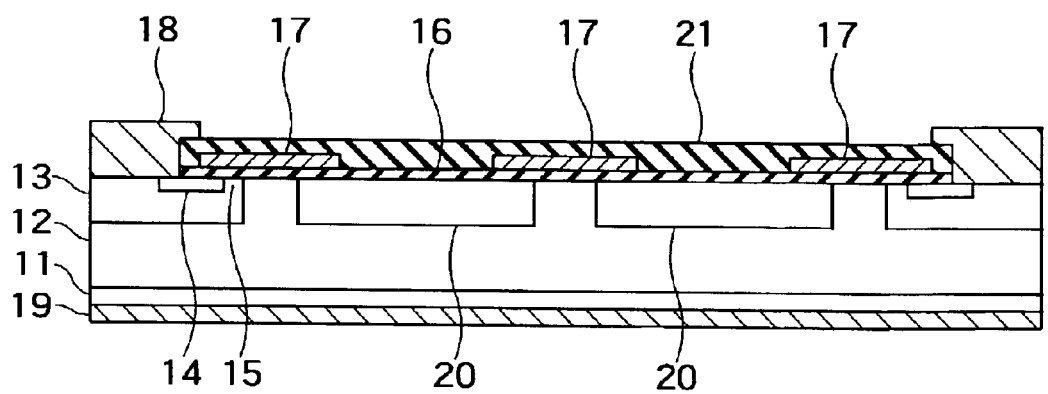
FIG. 6 is a cross-sectional structural view of a semiconductor device in accordance with a third embodiment of the present invention.

FIG. 6 is a cross-sectional structural view of a semiconductor device in accordance with a third embodiment of the present invention.

The semiconductor device in accordance with the third embodiment of the present invention has the p⁺ type silicon substrate 11; the high-resistant n⁻ type layer 12 which is formed on the p⁺ type silicon substrate 11 and has a low impurity concentration; the plurality of p type base layers 13 which are formed at predetermined intervals in portions near the surface of the n⁻ type layer 12; the n⁺ type emitter layers 14 each of which is formed on a portion near the surface in the vicinity of each of both end portions of each p type base layer 13; the channel regions 15 each of which is formed in each of both end portions of each p type base layer 13; the p type auxiliary base layer 20 which is formed in a portion near the surface of the n⁻ type layer 12 between the two channel regions 15 which are adjacent to each other via a portion near the surface of n⁻ type layer 12 in a state where it is separated from the above-mentioned two channel regions 15 and is divided into a plurality of portions; the gate insulating films 16 each of which is formed on a region extending from one of the above-mentioned two channel regions 15 to the other; the gate electrodes 17 which are formed on the gate insulating film 16 in a region extending from the channel region 15, which is adjacent to one end of one of the p type auxiliary base layer 20 on both ends of the plurality of p type auxiliary base layers 20 via a portion near the surface of the n⁻ type layer 12, to the above-mentioned one end of the above-mentioned one of the p type auxiliary base layer 20, on the gate insulating film 16 in a region extending from the channel region 15, which is adjacent to one end of the other of the p type auxiliary base layer 20 on both ends of the plurality of p type auxiliary base layers 20 via a portion near the surface of the n⁻ type layer 12, to the above-mentioned one end of the above-mentioned other of the p type auxiliary base layer 20, and on the gate insulating film 16 in a region extending from one end portion of one of two p type auxiliary base layers 20, end portions of which are positioned at portions where the plurality of p type auxiliary base layers 20 are divided, to the end portion of the other of the two p type auxiliary base layers 20, respectively; the insulating film 21 which is formed on a region over the gate insulating film 16 so as to cover each gate electrode 17; the emitter electrode 18 which is formed so as to be in ohmic contact with the surfaces of the p type base layer 13 and the $n^+$ type emitter layer 14 except for a portion covered with the gate insulating film 16; and the collector electrode 19 which is formed so as to be in ohmic contact with the reverse surface of the $p^+$ type silicon substrate 11.

The semiconductor device in accordance with the third embodiment of the present invention is different from the semiconductor device in accordance with the second embodiment of the present invention only in that the gate electrode 17 is formed also on the gate insulating film 16 in the region extending from one end portion of one of two p type auxiliary base layers 20, end portions of which are positioned at portions where the plurality of p type auxiliary base layers 20 are divided, to the end portion of the other of the two p type auxiliary base layers 20. However, all the other constitutions thereof are the same as those of the second embodiment of the present invention.

The semiconductor device in accordance with the third embodiment of the present invention can also produce the same effect as the semiconductor device in accordance with the second embodiment of the present invention, that is, the same effect as the semiconductor device in accordance with the first embodiment of the present invention.

Figure 7:
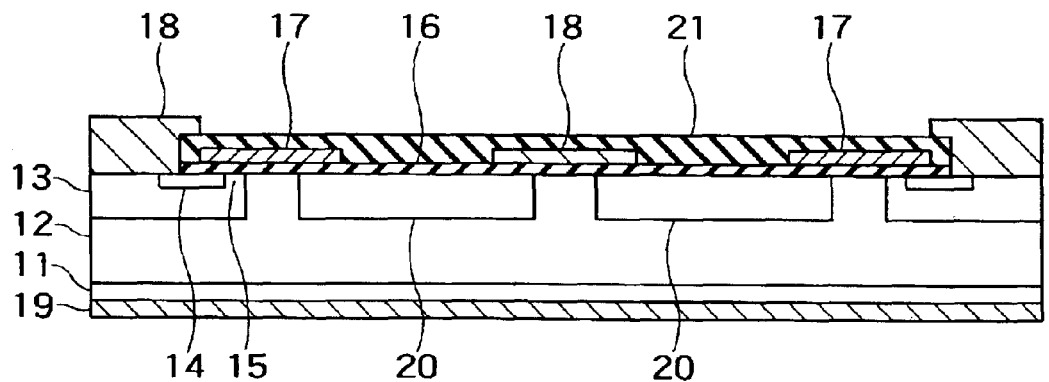
FIG. 7 is a cross-sectional structural view of a semiconductor device in accordance with a fourth embodiment of the present invention.

FIG. 7 is a cross-sectional structural view of a semiconductor device in accordance with a fourth embodiment of the present invention.

The semiconductor device in accordance with the fourth embodiment of the present invention has the $p^+$ type silicon substrate 11; the high-resistant $n^-$ type layer 12 which is formed on the $p^+$ type silicon substrate 11 and has a low impurity concentration; the plurality of p type base layers 13 which are formed at predetermined intervals in portions near the surface of the $n^-$ type layer 12; the $n^+$ type emitter layers 14 each of which is formed in a portion near the surface in the vicinity of each of both end portions of each p type base layer 13; the channel regions 15 each of which is formed on both end portions of each p type base layer 13; the p type auxiliary base layer 20 which is formed on a portion near the surface of the $n^-$ type layer 12 between the two channel regions 15 which are adjacent to each other via a portion near the surface of $n^-$ type layer 12 in a state where it is separated from the above-mentioned two channel regions 15 and is divided into a plurality of portions; the gate insulating films 16 each of which is formed on a region extending from one of the two channel regions 15 to the other; the gate electrodes 17 which are formed on the gate insulating film 16 in a region extending from the channel region 15, which is adjacent to one end of one of the p type auxiliary base layer 20 on both ends of the plurality of p type auxiliary base layers 20 via a portion near the surface of the $n^-$ type layer 12, to the above-mentioned one end of the above-mentioned one of the p type auxiliary base layer 20, and on the gate insulating film 16 in a region extending from the channel region 15, which is adjacent to one end of the other of the p type auxiliary base layer 20 on both ends of the plurality of p type auxiliary base layers 20 via a portion near the surface of the $n^-$ type layer 12, to the above-mentioned one end of the above-mentioned other of the p type auxiliary base layer 20, respectively; the insulating films 21 each of which is formed on a region over the gate insulating film 16 so as to cover each gate electrode 17; the emitter electrodes 18 each of which is formed so as to be in ohmic contact with the surfaces of the p type base layer 13 and the $n^+$ type emitter layer 14 except for a portion covered with the gate insulating film 16, and is formed on the gate insulating film 16 in the region extending from one end portion of one of two p type auxiliary base layers 20, the end portions of which are positioned at portions where the plurality of p type auxiliary base layers 20 are divided, to the end portion of the other of two p type auxiliary base layers 20; and the collector electrode 19 which is formed so as to be in ohmic contact with the reverse surface of the $p^+$ type silicon substrate 11.

The semiconductor device in accordance with the fourth embodiment of the present invention is different from the semiconductor device in accordance with the third embodiment of the present invention only in that not the gate electrode 17 but the emitter electrode 18 is formed on the gate insulating film 16 in the region extending from one end portion of one of two p type auxiliary base layers 20, the end portions of which are positioned at portions where the plurality of p type auxiliary base layers 20 are divided, to the end portion of the other of the two p type auxiliary base layers 20. However, all the other constitutions thereof are the same as those of the third embodiment of the present invention.

The semiconductor device in accordance with the fourth embodiment of the present invention can also produce the same effect as the semiconductor device in accordance with the third embodiment of the present invention, that is, the same effect as the semiconductor device in accordance with the first embodiment of the present invention.

Figure 8:
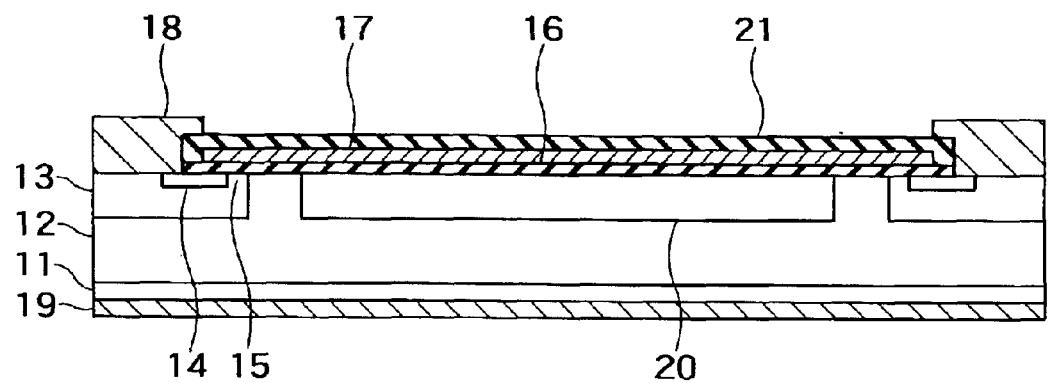
FIG. 8 is a cross-sectional structural view of a semiconductor device in accordance with a fifth embodiment of the present invention.

FIG. 8 is a cross-sectional structural view of a semiconductor device in accordance with a fifth embodiment of the present invention.

The semiconductor device in accordance with the fifth embodiment of the present invention has the $p^+$ type silicon substrate 11; the high-resistant $n^-$ type layer 12 which is formed on the $p^+$ type silicon substrate 11 and has a low impurity concentration; the plurality of p type base layers 13 which are formed at predetermined intervals in portions near the surface of the $n^-$ type layer 12; the $n^+$ type emitter layers 14 each of which is formed on a portion near the surface in the vicinity of each of both end portions of each p type base layer 13; the channel regions 15 each of which is formed in each of both end portions of each p type base layer 13; the p type auxiliary base layer 20 which is formed in a portion near the surface of the $n^-$ type layer 12 between two channel regions 15 which are adjacent to each other via a portion near the surface of $n^-$ type layer 12 in a state where it is separated from the above-mentioned two channel regions 15; the gate insulating films 16 each of which is formed on a region extending from one of the two channel regions 15 to the other; the gate electrodes 17 each of which is formed on the gate insulating film 16 in a region extending from one of the two channel region 15 to the other; the insulating films 21 each of which is formed on a region over the gate insulating film 16 so as to cover each gate electrode 17; the emitter electrodes 18 each of which is formed so as to be in ohmic contact with the surfaces of the p type base layer 13 and the $n^+$ type emitter layer 14 except for a portion covered with the gate insulating film 16; and the collector electrode 19 which is formed so as to be in ohmic contact with the reverse surface of the $p^+$ type silicon substrate 11.

The semiconductor device in accordance with the fifth embodiment of the present invention is different from the semiconductor device in accordance with the first embodiment of the present invention only in that the gate electrode 17 is continuously formed on the gate insulating film 16 in the region extending from one of the two channel regions 15 to the other. However, all the other constitutions thereof are the same as those of the first embodiment of the present invention.

The semiconductor device in accordance with the fifth embodiment of the present invention can also produce the same effect as the semiconductor device in accordance with the first embodiment of the present invention, and in the structure of the semiconductor device in accordance with the fifth embodiment of the present invention, a gate resistance in the device is reduced to realize a higher-speed switching operation.

Figure 9:
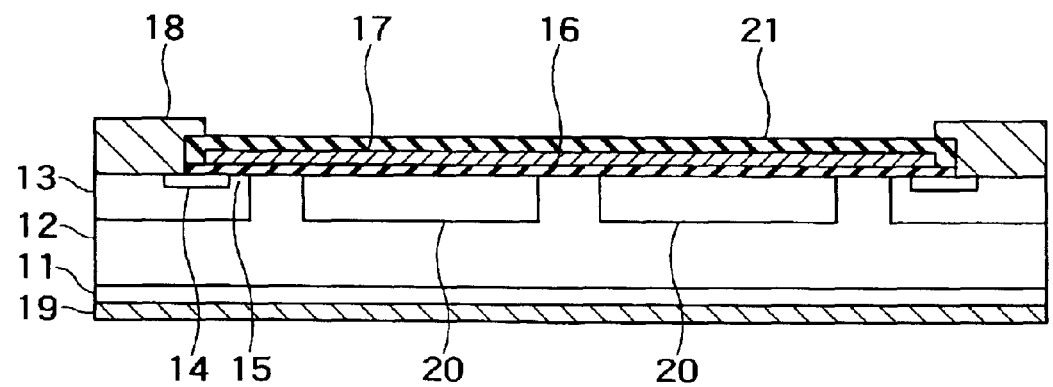
FIG. 9 is a cross-sectional structural view of a semiconductor device in accordance with a sixth embodiment of the present invention.

FIG. 9 is a cross-sectional structural view of a semiconductor device in accordance with a sixth embodiment of the present invention.

The semiconductor device in accordance with the sixth embodiment of the present invention has the p⁺ type silicon substrate 11; the high-resistant n⁻ type layer 12 which is formed on the p⁺ type silicon substrate 11 and has a low impurity concentration; the plurality of p type base layers 13 which are formed at predetermined intervals in portions near the surface of the n⁻ type layer 12; the n⁺ type emitter layers 14 each of which is formed in a portion near the surface in the vicinity of each of both end portions of each p type base layer 13; the channel regions 15 each of which is formed in each of both end portions of each p type base layer 13; the p type auxiliary base layer 20 which is formed in a portion near the surface of the n⁻ type layer 12 between two channel regions 15 which are adjacent to each other via a portion near the surface of n⁻ type layer 12 in a state where it is separated from the above-mentioned two channel regions 15 and is divided into a plurality of parts; the gate insulating films 16 each of which is formed on a region extending from one of the two channel regions 15 to the other; the gate electrodes 17 each of which is formed on the gate insulating film 16 in a region extending from one of the two channel region 15 to the other; the insulating films 21 each of which is formed on a region over the gate insulating film 16 so as to cover each gate electrode 17; the emitter electrodes 18 which is formed so as to be in ohmic contact with the surfaces of the p type base layer 13 and the n⁺ type emitter layer 14 except for a portion covered with the gate insulating film 16; and the collector electrode 19 which is formed so as to be in ohmic contact with the reverse surface of the p⁺ type silicon substrate 11.

The semiconductor device in accordance with the sixth embodiment of the present invention is different from the semiconductor device in accordance with the second embodiment of the present invention only in that the gate electrode 17 is continuously formed on the gate insulating film 16 in the region extending from one of the two channel regions 15 to the other. However, all the other constitutions thereof are the same as those of the second embodiment of the present invention.

The semiconductor device in accordance with the sixth embodiment of the present invention can also produce the same effect as the semiconductor device in accordance with the second embodiment of the present invention, that is, the same effect as the first embodiment of the present invention, and in the structure of the semiconductor device in accordance with the sixth embodiment of the present invention, as is the case with the semiconductor device in accordance with the fifth embodiment of the present invention, a gate resistance in the element is reduced to realize a higher-speed switching operation.

As described above, according to the semiconductor device in accordance with the present invention, in the planar gate type IGBT, the plurality of auxiliary base layers are formed in the surface of the semiconductor layer (second semiconductor layer) between two base layers adjacent to each other, so that the emitter contact area per unit area can be reduced without enlarging the width of the gate electrode to prevent the holes implanted from the fist conduction type silicon substrate to the second conduction type high-resistant layer from being discharged more than necessary, which can increase the carrier density of the holes right below the first conduction type auxiliary base layer. As a result, it is possible to easily and effectively to realize a low ON voltage and a high-speed switching characteristic while avoiding a decrease in the withstand voltage, an increase in the input capacity Cies and the feedback capacity Cres, and the occurrence of oscillation when a load is short-circuited.

What is claimed is:

1. A semiconductor device comprising:

a first conduction type first semiconductor layer;

a second conduction type second semiconductor layer which is formed on the first semiconductor layer and has a substantially uniform impurity concentration;

a plurality of first conduction type base layers formed in the surface of the second semiconductor layer;

a plurality of second conduction type emitter layers formed in the surface of the respective base layers;

channel regions formed in the surfaces of the respective base layers and between the emitter layers and the second semiconductor layer;

a first conduction type auxiliary base layer formed in the surface of the second semiconductor layer between the two base layers adjacent to each other;

a gate electrode formed via a sate insulating film on the second semiconductor layer between the auxiliary base layer and the two base layers and on the channel regions;

an emitter electrode connected to the base layers and the emitter layers; and a collector electrode connected to the first semiconductor layer, wherein the auxiliary base layer is partially connected to the base layer by a diffusion layer.

2. A semiconductor device comprising:

a first conduction type first semiconductor layer;

a second conduction type second semiconductor layer formed on the first semiconductor layer;

a plurality of first conduction type base layers formed in the surface of the second semiconductor layer;

a plurality of second conduction type emitter layers formed in the surface of the respective base layers;

channel regions formed in the surfaces of the respective base layers and between the emitter layers and the second semiconductor layer;

a first conduction type auxiliary base layer which is formed in the surface of the second semiconductor layer between the two base layers adjacent to each other and whose depth from the surface of the second semiconductor layer is substantially equal to a depth of the base layer;

a gate electrode formed via a gate insulting film on the second semiconductor layer between the auxiliary base layer and the two base layers and on the channel regions;

an emitter electrode connected to the base layers and the emitter layers; and a collector electrode connected to the first semiconductor layer.

3. A semiconductor device according to claim 2, wherein an electric potential of the auxiliary base layer is at a floating potential.

4. A semiconductor device according to claim 2, wherein the auxiliary base layer is partially connected to the base layer by a diffusion layer.

5. A semiconductor device comprising:

a first conduction type first semiconductor layer;

a second conduction type second semiconductor layer formed on the first semiconductor layer;

a plurality of first conductor type base layers formed in the surface of the second semiconductor layer;

a plurality of second type emitter layers formed in the surface of the respective base layers;

channel regions formed in the surfaces of the respective base layers and between the emitter layers and the second semiconductor layer;

a plurality of first conduction type auxiliary base layers formed in the surface of the second semiconductor layer between the two base layers adjacent to each other;

a gate electrodes formed via agate insulating film on the second semiconductor layer between the auxiliary base layers and the two base layers and on the channel regions;

an emitter electrode connected to the base layers and the emitter layers; and a collector electrode connected to the first semiconductor layer.

6. A semiconductor device according to claim 5, wherein the gate electrode is formed via the gate insulating film on the second semiconductor layer between the two auxiliary base layers adjacent to each other.

7. A semiconductor device according to claim 5, wherein the emitter electrode is connected to the base layer and the emitter layer and is formed via the gate insulating film on the second semiconductor layer between the two auxiliary base layers adjacent to each other.

8. A semiconductor device according to claim 5, wherein the gate electrode is formed via the gate insulating film on a region extending from one to the other of the two channel regions between the auxiliary base layers and the two base layers.

9. A semiconductor device according to claim 5, wherein the second semiconductor layer has a substantially uniform impurity concentration.

10. A semiconductor device according to claim 5, wherein a depth of the auxiliary base layer from the surface of the second semiconductor layer is substantially equal to a depth of the base layer.

11. A semiconductor device according to claim 5, wherein an electric potential of the auxiliary base layer is at a floating potential.

12. A semiconductor device according to claim 5, wherein the auxiliary base layer is partially connected to the base layer by a diffusion layer.

13. A semiconductor device comprising:

a first conduction type first semiconductor layer;

a second conduction type second semiconductor layer formed on the first semiconductor layer;

a plurality of first conduction type base layers formed in the surface of the second semiconductor layer;

a plurality of second conduction type emitter layers formed in the surface of the respective base layers;

channel regions formed in the surfaces of the respective base layers and between the emitter layers and the second semiconductor layer;

a first conduction type auxiliary base layer formed in the surface of the second semiconductor layer between the two base layers adjacent to each other;

a gate electrode formed on a region extending from one of the two channel regions between the auxiliary base layer and the two base layers to the other;

an emitter electrode connected to the base layers and the emitter layers; and a collector electrode connected to the first semiconductor layer, wherein a depth of the auxiliary base layer from the surface of the second semiconductor layer is substantially equal to a depth of the base layer.

14. A semiconductor device according to claim 13, wherein the second semiconductor layer has a substantially uniform impurity concentration.

15. A semiconductor device according to claim 13, wherein an electric potential of the auxiliary base layer is at a floating potential.

16. A semiconductor device according to claim 13, wherein the auxiliary base layer is partially connected to the base layer by a diffusion layer.

17. A semiconductor device comprising:

a first conduction type first semiconductor layer;

a second conduction type second semiconductor layer formed on the first semiconductor layer;

a plurality of first conduction type base layers formed in the surface of the second semiconductor layer;

a plurality of second conduction type emitter layers formed in the surface of the respective base layers;

channel regions formed in the surfaces of the respective base layers and between the emitter layers and the second semiconductor layer;

a first conduction type auxiliary base layer formed in the surface of the second semiconductor layer between the two base layers adjacent to the other;

a gate electrode formed on a region extending from one of the two channel regions between the auxiliary base layer and the two base layers to each other;

an emitter electrode connected to the base layers and the emitter layers; and a collector electrode connected to the first semiconductor layer, wherein the auxiliary base layer is partially connected to the base layer by a diffusion layer.

18. A semiconductor device according to claim 17, wherein the second semiconductor layer has a substantially uniform impurity concentration.

* * * * *